United States Patent [19]
Ishii

[11] Patent Number: 5,388,103
[45] Date of Patent: Feb. 7, 1995

[54] FREQUENCY STABILIZER FOR USE IN PHASE-SHIFT KEYING RADIO COMMUNICATIONS SYSTEM

[75] Inventor: Junichi Ishii, Tokyo, Japan

[73] Assignee: NEC Corporation, Tokyo, Japan

[21] Appl. No.: 135,408

[22] Filed: Oct. 13, 1993

[30] Foreign Application Priority Data

Oct. 13, 1992 [JP]  Japan .................................. 4-273953

[51] Int. Cl.⁶ ................................................. H04J 3/06
[52] U.S. Cl. ................................ 370/100.1; 370/105.1; 375/118
[58] Field of Search ................... 370/105.3, 100.1, 105, 370/105.1, 105.2; 375/112, 118

[56] References Cited

U.S. PATENT DOCUMENTS

| | | | |
|---|---|---|---|
| 4,860,319 | 8/1989 | Yoshida | 375/118 |
| 5,077,794 | 12/1991 | Taylor | 375/112 |
| 5,115,452 | 5/1992 | Cupo | 375/118 |

*Primary Examiner*—Douglas W. Olms
*Assistant Examiner*—Ajit Patel

*Attorney, Agent, or Firm*—Sughrue, Mion, Zinn, Macpeak & Seas

[57] ABSTRACT

A frequency stabilizer for use in a time-division multiplexed digital cellular system is designed to reduce the consumption of electric power by means of a receiving circuit in continuous frequency control. The frequency stabilizer includes a pair of latches 4 and 5 for latching a phase error of an output signal from a phase error integrating circuit 2, a subtractor 6 for outputting the difference between respective output signals from the latches 4, 5, and a selector switch 8 for selecting and outputting an output signal from a phase-to-frequency converter 3 in the period of a reception slot and an output signal from a frequency correcting circuit 7 between reception slots. When the selector switch 8 is selecting the output signal from the frequency correcting circuit 7, no electrical energy is supplied to the receiving circuit. Even when the frequency stabilizer is in continuous operation, the receiving circuit operates only during the reception slot, resulting in reduced consumption of electrical energy.

8 Claims, 3 Drawing Sheets

FREQUENCY STABILIZER FOR USE IN PHASE-SHIFT KEYING RADIO COMMUNICATIONS SYSTEM

BACKGROUND OF THE INVENTION

1. Field of the Invention

The present invention relates to a frequency stabilizer, and more particularly to a frequency stabilizer for use in a time-division multiplexed digital cellular system.

2. Description of the Relevant Art

One known digital cellular system is a time-division multiplex access (TDMA) digital cellular system. One conventional frequency stabilizer will be described below with reference to FIG. 1 of the accompanying drawings.

Figure 1:
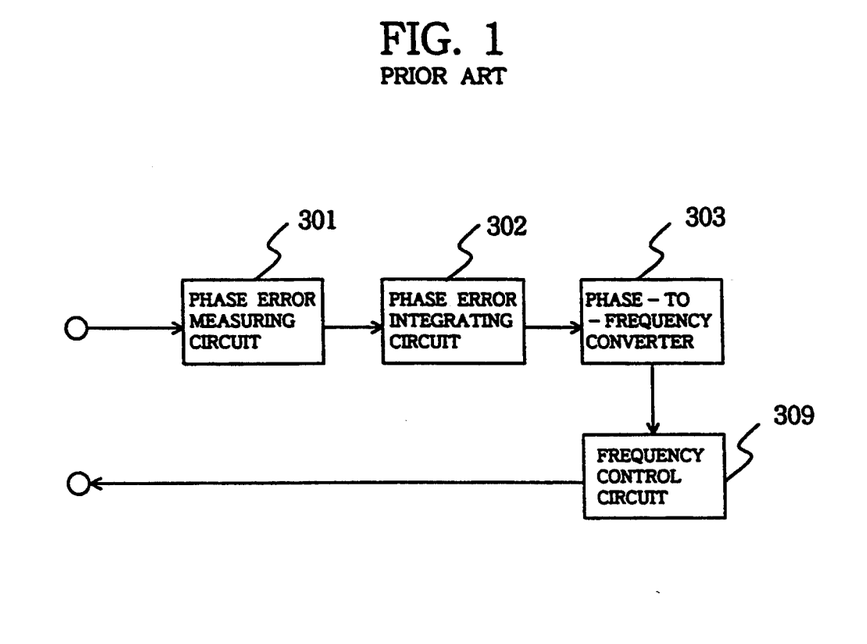
FIG. 1 is a block diagram of a conventional frequency stabilizer.

As shown in FIG. 1, the conventional frequency stabilizer comprises a phase error measuring circuit 301 for outputting phase error information in response to a received signal applied thereto, a phase error integrating circuit 302 for integrating the phase error information supplied from the phase error measuring circuit 301, a phase-to-frequency converter 303 for converting the integrated phase error information outputted from the phase error integrating circuit 302 to frequency error information, and a frequency control circuit 309 for controlling the frequency of the receiver with the frequency error information outputted from the phase-to-frequency converter 303.

The conventional frequency stabilizer operates as follows: A radio signal which has been modulated by π/4DQPSK (π/4 differential quadrature phase-shift keying) and received by a receiver is applied at all times to the phase error measuring circuit 301, which converts the applied signal to a phase error signal. The phase error signal is integrated by the phase error integrating circuit 302. If the receiver has a frequency error with respect to the received signal, then the phase error integrating circuit 302 outputs phase error information. The phase error information outputted from the phase error integrating circuit 302 is converted by the phase-to-frequency converter 303 to frequency error information, which is then outputted to the frequency control circuit 309. The frequency control circuit 309 controls the frequency of the receiver based on the supplied frequency error information.

The frequency stabilizer operates to equalize the frequency of the receiver with the signal frequency. However, the frequency stabilizer cannot control the frequency with high stability unless the receiver is also capable of receiving signals in other slots than the slot in which the signal is being received. For effecting the frequency control at all times, it is necessary to turn on the power supply of the receiver at all times. Therefore, the frequency stabilizer requires the use of a large amount of electrical energy.

SUMMARY OF THE INVENTION

It is therefore an object of the present invention to provide a frequency stabilizer which can reduce the consumption of electrical energy.

According to an aspect of the present invention, there is provided a frequency stabilizer for use in a radio communications system for transmitting a signal modulated by phase-shift keying in a time-division multiplex process, the frequency stabilizer comprising a phase error measuring circuit for measuring a phase error between a signal received by a receiver in the period of a reception slot and a symbol point (a symbol point being a phase state which, in relation to the previous phase state, indicates the value of 2 bits of data); a phase error integrating circuit for integrating an output signal from the phase error measuring circuit; a phase-to-frequency converter for converting an output signal from the phase error integrating circuit to a frequency error; a power supply circuit for supplying electrical energy to the phase error measuring circuit, the phase error integrating circuit, and the phase-to-frequency converter; a change detecting circuit for detecting a change in the output signal from the phase error integrating circuit; a frequency correcting circuit for predicting a frequency correcting quantity between reception slots with an output signal from the change detecting circuit; a selector switch for receiving the output signals from the phase-to-frequency converter and the frequency correcting circuit, for selecting the output signal from the phase-to-frequency converter and outputting the selected output signal to an output terminal thereof in the period of the reception slot, selecting the output signal from the frequency correcting circuit and outputting the selected output signal to the output terminal between the reception slots, and outputting a power supply control signal indicative of the presently selected output signal to the power supply circuit; and a frequency controller for controlling the frequency of the receiver depending on an output signal from the selector switch; the power supply circuit comprising means for preventing electrical energy from being supplied to the phase error measuring circuit, the phase error integrating circuit, and the phase-to-frequency converter when the power supply circuit is supplied with a power supply control signal from the selector switch indicating that the selector switch is selecting the output signal from the frequency correcting circuit.

According to another aspect of the present invention, there is provided a frequency stabilizer for use in a radio communications system for transmitting a signal modulated by phase-shift keying in a time-division multiplex process, the frequency stabilizer comprising a phase error measuring circuit for measuring a phase error between a signal received by a receiver in the period of a reception slot and a symbol point; a phase error integrating circuit for integrating an output signal from the phase error measuring circuit; a phase-to-frequency converter for converting an output signal from the phase error integrating circuit to a frequency error; a power supply circuit for supplying electrical energy to the phase error measuring circuit, the phase error integrating circuit, and the phase-to-frequency converter; a change detecting circuit for detecting a change in the output signal from the phase error integrating circuit; a frequency correcting circuit for predicting a frequency correcting quantity between reception slots with an output signal from the change detecting circuit; a selector switch for receiving the output signals from the phase-to-frequency converter and the frequency correcting circuit, for selecting the output signal from the phase-to-frequency converter and outputting the selected output signal to an output terminal thereof in the period of the reception slot, and selecting the output signal from the frequency correcting circuit and outputting the selected output signal to the output terminal between the reception slots; and a frequency controller for controlling the frequency of the receiver depending on an output signal from the selector switch; the power supply circuit comprising means for preventing electrical energy from being supplied to the phase error measuring circuit, the phase error integrating circuit, and the phase-to-frequency converter between the reception slots.

According to still another aspect of the present invention, there is provided a frequency stabilizer for use in a radio communications system for transmitting a signal modulated by phase-shift keying in a time-division multiplex process, the frequency stabilizer comprising a phase error measuring circuit for measuring a phase error between a signal received by a receiver in the period of a reception slot and a symbol point; a phase error integrating circuit for integrating an output signal from the phase error measuring circuit; a phase-to-frequency converter for converting an output signal from the phase error integrating circuit to a frequency error; a power supply circuit for supplying electrical energy to the phase error measuring circuit, the phase error integrating circuit, and the phase-to-frequency converter; a change detecting circuit for detecting a change in the output signal from the phase error integrating circuit; a selector switch for receiving the output signals from the phase-to-frequency converter and the frequency correcting circuit, for selecting the output signal from the phase-to-frequency converter and outputting the selected output signal to an output terminal thereof in the period of the reception slot, selecting the output signal from the frequency correcting circuit and outputting the selected output signal to the output terminal between the reception slots, and outputting a power supply control signal indicative of the presently selected output signal to the power supply circuit; a frequency correcting circuit for predicting a frequency correcting quantity using an output signal from the selector switch; and a frequency controller for controlling the frequency of the receiver depending on an output signal from the frequency correcting circuit; the power supply circuit comprising means for preventing electrical energy from being supplied to the phase error measuring circuit, the phase error integrating circuit, and the phase-to-frequency converter when the power supply circuit is supplied with a power supply control signal from the selector switch indicating that the selector switch is selecting the output signal from the change detecting circuit.

According to yet another aspect of the present invention, there is provided a frequency stabilizer for use in a radio communications system for transmitting a signal modulated by phase-shift keying in a time-division multiplex process, the frequency stabilizer comprising a phase error measuring circuit for measuring a phase error between a signal received by a receiver in the period of a reception slot and a symbol point; a phase error integrating circuit for integrating an output signal from the phase error measuring circuit; a phase-to-frequency converter for converting an output signal from the phase error integrating circuit to a frequency error; a power supply circuit for supplying electrical energy to the phase error measuring circuit, the phase error integrating circuit, and the phase-to-frequency converter; a change detecting circuit for detecting a change in the output signal from the phase error integrating circuit; a selector switch for receiving the output signals from the phase-to-frequency converter and the frequency correcting circuit, for selecting the output signal from the phase-to-frequency converter and outputting the selected output signal to an output terminal thereof in the period of the reception slot, and selecting the output signal from the frequency correcting circuit and outputting the selected output signal to the output terminal between the reception slots; a frequency correcting circuit for predicting a frequency correcting quantity using an output signal from the selector switch; and a frequency controller for controlling the frequency of the receiver depending on an output signal from the frequency correcting circuit; the power supply circuit comprising means for preventing electrical energy from being supplied to the phase error measuring circuit, the phase error integrating circuit, and the phase-to-frequency converter between the reception slots.

In each of the above frequency stabilizers, the change detecting circuit may have a subtractor for detecting the difference between phase errors which are outputted from said phase error integrating circuit in the first half and second half of the period of the reception slot.

During the reception slot in which frequency control is of particular importance, a receiving circuit that is composed of the phase error measuring circuit, the phase error integrating circuit, and the phase-to-frequency converter is supplied with electrical energy from the power supply circuit, and an output signal from the receiving circuit is selected for stabilizing the frequency of the receiver. Between the reception slots, no electrical energy is supplied to the receiving circuit, and the frequency is controlled based on an output signal from the change detecting circuit.

The above and other objects, features, and advantages of the present invention will become apparent from the following description when taken in conjunction with the accompanying drawings which illustrate a preferred embodiment of the present invention by way of example.

DETAILED DESCRIPTION OF THE PREFERRED EMBODIMENT

Figure 2:
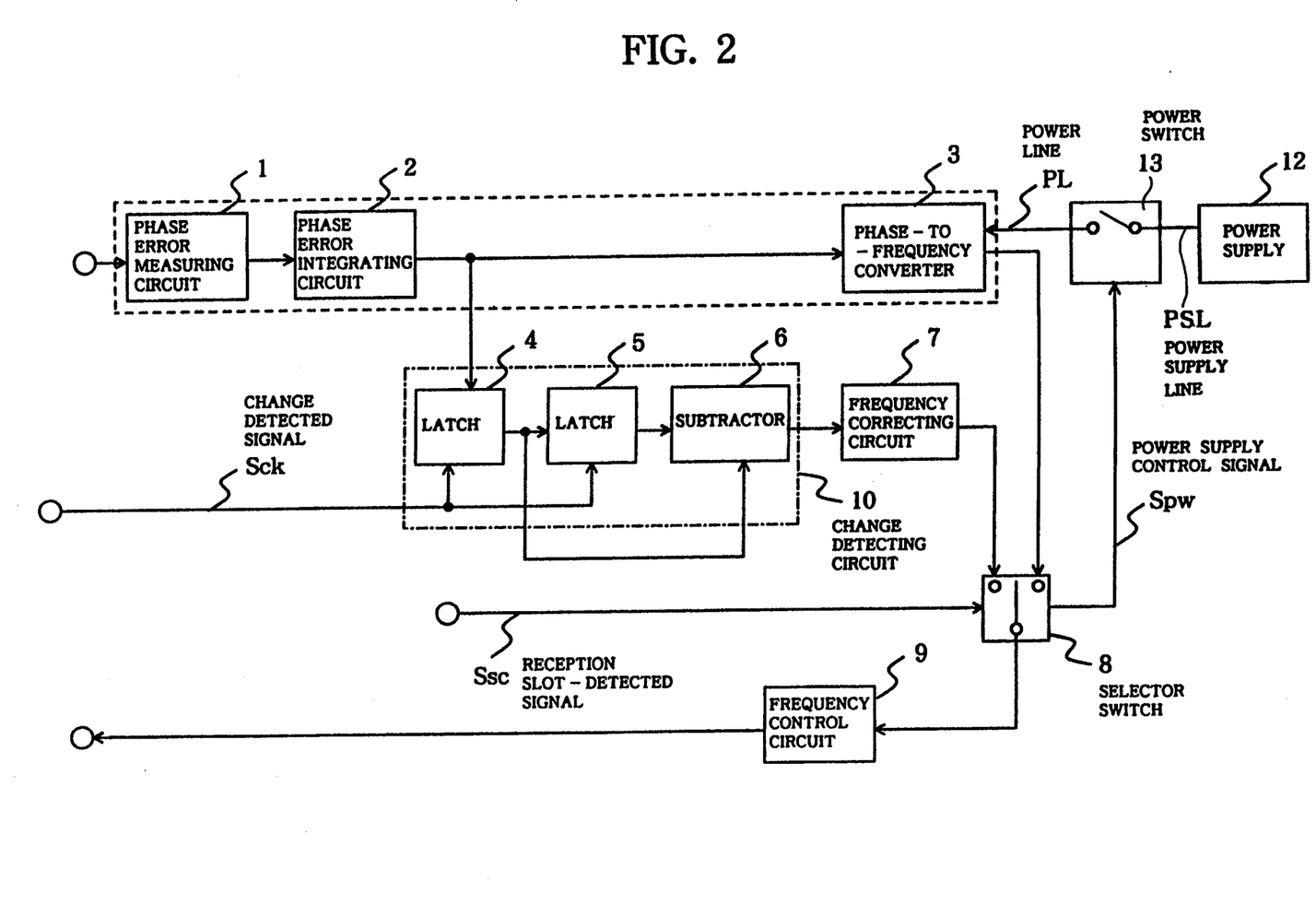
FIG. 2 is a block diagram of a frequency stabilizer according to the present invention.

As shown in FIG. 2, a frequency stabilizer according to the present invention comprises a phase error measuring circuit 1 for measuring a phase error from a symbol point of a signal that is inputted from a receiver in the period of a reception slot; a phase error integrating circuit 2 for integrating the phase error outputted from the phase error measuring circuit 1; a phase-to-frequency converter 3 for converting the integrated phase error outputted from the phase error integrating circuit 2 to a frequency error; a change detecting circuit 10 for detecting a change in the integrated phase error outputted from the phase error integrating circuit 2; a frequency correcting circuit 7 that uses an output signal from the change detecting circuit 10 for predicting a frequency correcting quantity between slots other than the reception; a selector switch 8 for receiving the output signals from the phase-to-frequency converter 3 and the frequency correcting circuit 7, selecting and outputting the output signal from the phase-to-frequency converter 3 during the reception slot, and selecting and outputting the output signal from the frequency correcting circuit 7 between slots other than the reception slot; a frequency controller 9 for controlling the frequency of the receiver with an output signal from the selector switch 8; and a power supply circuit 12 for supplying electrical energy over a power line PL to a receiving circuit that is composed of the phase error measuring circuit 1, the phase error integrating circuit 2, and the phase-to-frequency converter 3.

The change detecting circuit 10 comprises a latch 4 for latching a phase error in a first half of the period of the reception slot, a latch 5 for latching a phase error in a second half of the period of the reception slot, and a subtractor 6 for detecting the difference between the output signals from the latches 4 and 5.

The above elements of the frequency stabilizer will be described below.

Phase Error Measuring Circuit 1

The phase error measuring circuit 1 is functionally performed by a demodulator, which in practice may be composed of a delay detector, a delay equalizer, or the like. A phase error detecting block in such a delay detector is illustrated in FIG. 3.

Figure 3:
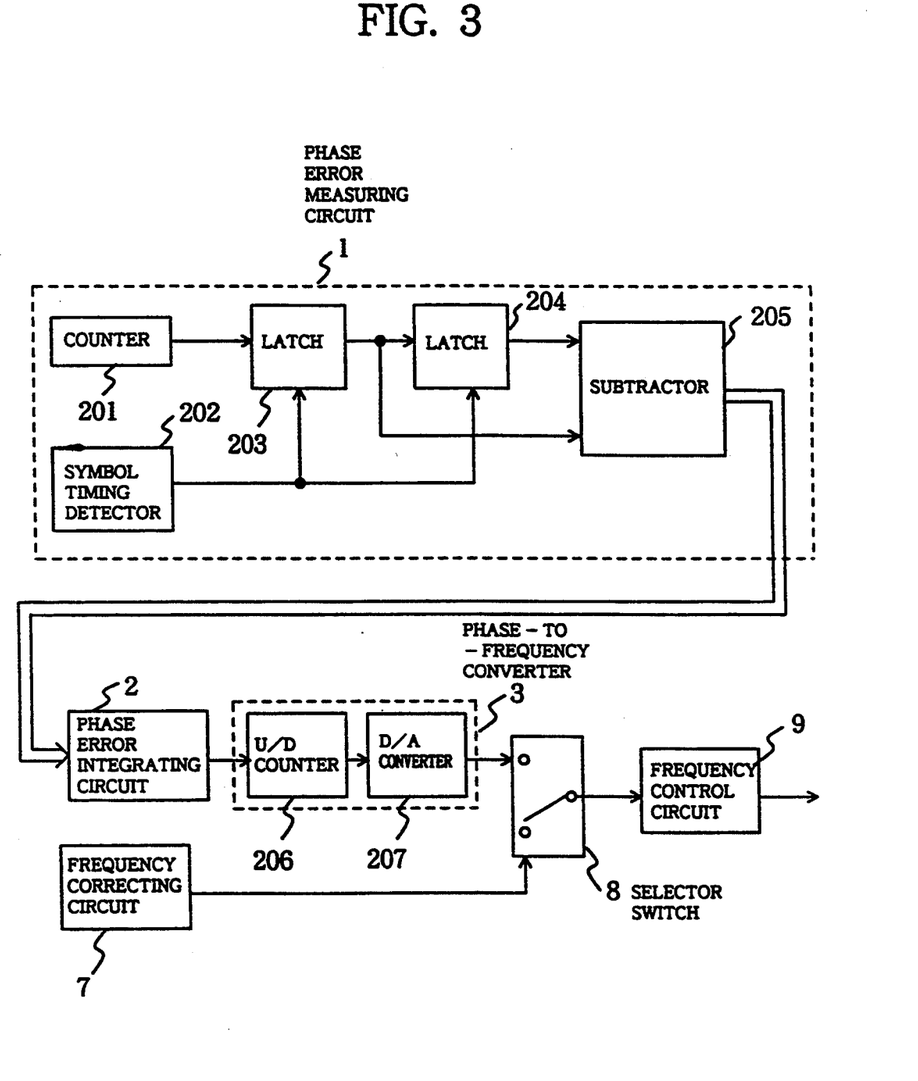
FIG. 3 is a block diagram of a phase error detecting block in a delay detector that is employed in the frequency stabilizer shown in FIG. 2.

As shown in FIG. 3, the phase error measuring circuit 1 comprises a counter 201, a symbol timing detector 202, a pair of latches 203 and 204, and a subtractor 205.

The symbol timing detector 202 detects and outputs a synchronizing symbol timing clock signal contained in a signal transmitted from a base.

In $\pi/4$DQPSK, data are transmitted after delaying the phase of the data by one symbol period "T+ after the phase at a time t0, and phase changes $\pi/4$, $3\pi/4$, $-\pi/4$, and $-3\pi/4$ are assigned the 2-bit code data 00, 01, 10, and 11, respectively. Phase data are generated by the counter 201, which rotates one cycle per period of input signal applied thereto. The counter 201 applies an output signal to the latch 203, which latches the applied signal as n-bit parallel data in a timed relationship to one period of the synchronizing symbol clock signal from the symbol timing detector 202. At the same time, the latch 204 latches the data which have been latched by the latch 203 in a previous period of the synchronizing symbol clock signal. The latches 203 and 204 apply their output signals to the subtractor 205, which produces phase difference information representing the phase difference between the output signals from the latches 203 and 204. Of the produced phase difference information, the two highest-order bits correspond to phase information such as $\pi/4$, $3\pi/4$, ..., described above, and the two lowest-order (n, n−1) bits correspond to a phase error.

Phase Error Integrating Circuit 2

Under white noise, the integrated value ideally becomes 0 as the phase errors 1 are integrated and canceled out in positive and negative directions. If phase errors have a frequency offset, they will be integrated in either a positive direction or a negative direction. An integrator used integrates the two lowest-order (n, n−1) inputted bits represented by two's complements, and, as a result, outputs a carry/borrow.

Phase-to-Frequency Converter 3

The phase-to-frequency converter 3 converts the output signal from the phase error integrating circuit 2 to a frequency control signal, and outputs control data based on the frequency control signal to the frequency controller 9. In FIG. 3, the phase-to-frequency converter 3 comprises an U/D counter 206 for converting the output signal from the phase error integrating circuit 2 to a frequency control signal and a D/A converter 207 for outputting control data to the frequency controller 9.

Frequency Correcting Circuit 7

The frequency correcting circuit 7 detects a corrective change for a frequency error during reception slots and outputs frequency correcting pulses depending on the detected corrective change. The frequency correcting circuit 7 also determines the sign and magnitude of a change per unit time of integrated frequency errors, changes either one of positive and negative corrective outputs to correct the sign and magnitude, and changes a correcting interval.

In this embodiment, the frequency correcting circuit 7 is followed by a PLL circuit or a narrow bandpass filter for synchronizing a reference carrier with a carrier component. The output signals and interval of the frequency correcting circuit 7 may be multiplied by a certain coefficient depending on the characteristics of the PLL circuit or the narrow bandpass filter following the frequency correcting circuit 7.

Frequency Controller 9

One example of the frequency controller 9 is an oscillator whose frequency is variable according to a controlling quantity. Since the frequency controller 9 is usually equipped with a PLL, the controlling quantity is applied to the reference oscillator of the PLL.

Operation of the frequency stabilizer will next be described.

In FIG. 2, in order to equalize the frequency of the receiver with the frequency of a time-division multiplexed signal which is received, a signal received in the period of a reception slot is applied to the phase error measuring circuit 1 and converted thereby to phase error information from a symbol point. The phase error information is then outputted to the phase error integrating circuit 2.

If the frequency of the receiver is not equal to the frequency of the received signal, then the integrated phase error value produced by the phase error integrating circuit 2 changes in either a positive direction or a negative direction. The output signal from the phase error integrating circuit 2 is converted to a frequency error by the phase-to-frequency converter 3. The output signal from the phase error integrating circuit 2 is also latched by the latches 4 and 5 in response to a change-detected signal Sck which rises two times between reception slots.

The change-detected signal Sck is used for each of the latches 4 and 5 to detect a phase change at a desired time in the period of the reception slot to determine a phase change per set time.

The phase error integrated information outputted without pulse delay from latch 4 and the phase error integrated information outputted from latch 5 are applied to the subtractor 6. The subtractor 6 detects the difference between the applied phase error integrated information, i.e., the output signals from the latches 4 and 5 and outputs the detected difference to the frequency correcting circuit 7.

A reception slot-detected signal Ssc will next be described. In order to recognize assigned time slots in TDMA communications, a known particular data pattern is inserted in a predetermined position in a transmitted slot. The receiver detects an assigned time slot from the particular data pattern and generates a signal as a reception slot-detected signal Ssc which remains high only during the detected time slot.

The frequency correcting circuit 7 determines and outputs a frequency correcting value between reception slots based on the information representing the difference between the phase errors. The output signals from the phase-to-frequency converter 3 and the frequency correcting circuit 7 are supplied to the selector switch 8.

The selector switch 8 is also supplied with the reception slot-detected signal Ssc, which is a signal for detecting a change in frequency converging operation between reception slots. Based on the reception slot-detected signal Ssc, the selector switch 8 confirms whether the present time is within the period of the reception slot or between reception slots.

If the present time is within the period of the reception slot, the selector switch 8 selects the output signal from the phase-to-frequency converter 3 and applies it to its output terminal. If the present time is between reception slots, the selector switch 8 selects the output signal from the frequency correcting circuit 7 and applies it to its output terminal. The selector switch 8 also outputs to the power switch 13 a power supply control signal Spw indicative of which signal it is selecting.

The power supply circuit 12 supplies electrical energy over the power supply line PSL to the power switch 13. The power switch 13 supplies electrical energy over the power line PL to the receiving circuit composed of the phase error measuring circuit 1, the phase error integrating circuit 2, and the phase-to-frequency converter 3 only during the time the power supply control signal Spw indicating that the selector switch 8 is selecting the output signal from the frequency correcting circuit 7 is supplied.

The frequency controller 9 is supplied with the output signal from the selector switch 8 and effects frequency control depending on the supplied output signal. In this embodiment, during the reception slot in which frequency control is of particular importance, the receiving circuit composed of the phase error measuring circuit 1, the phase error integrating circuit 2, and the phase-to-frequency converter 3 is supplied with electrical energy from the power supply circuit 12 in order to stabilize the frequency with the output signal from the receiving circuit. Between reception slots, the frequency is stabilized by the output signal from the change detecting circuit 10. At this time, no electrical energy is supplied to the receiving circuit, and hence the consumption of electrical energy is reduced.

In the above embodiment, the selector switch 8, which is supplied with the reception slot-detected signal Ssc, outputs the power supply control signal Spw indicative of the present selection based on the reception slot-detected signal Ssc, and the power switch 13 determines whether it is to supply electrical energy or not depending on the power supply control signal Spw. However, the power switch 13 may be supplied with the reception slot-detected signal Ssc and determine whether it is to supply electrical energy or not depending on the supplied reception slot-detected signal Ssc, whereas the selector switch 8 may only select one of the input signals without outputting the power supply signal Spw.

The receiving circuit has a correcting circuit similar to the frequency correcting circuit 7. For a simpler arrangement, however, a common correcting circuit may be connected between the selector switch 8 and the frequency controller 9. Therefore, the present invention is not limited to the illustrated embodiment.

While the present invention has been described with respect to a received signal that has been modulated by $\pi/4$DQPSK, the principles of the invention are also applicable to other phase-shift keying processes such as quadrature phase-shift keying (QPSK).

The present invention offers the following advantages: The receiving circuit composed of a phase error measuring circuit, a phase error integrating circuit, and a phase-to-frequency converter is energized to control the frequency of the receiver with the integrated value of phase errors from the receiving circuit only in the period of a reception slot. Between reception slots, the frequency of the receiver is controlled according to changes in the phase error in the reception slot. Therefore, even when the frequency stabilizer is in continuous operation, the receiving circuit operates only in the period of the reception slot. As a result, the electrical energy consumed by the receiving circuit is reduced.

Although a certain preferred embodiment of the present invention has been shown and described in detail, it should be understood that various changes and modifications may be made therein without departing from the scope of the appended claims.

What is claimed is:

1. A frequency stabilizer for use in a radio communications system for transmitting a signal modulated by phase-shift keying in a time-division multiplex process, comprising:

a phase error measuring circuit for measuring a phase error between a symbol point and a signal received by a receiver during a period of each of a plurality of reception time slots;

a phase error integrating circuit for integrating an output signal from said phase error measuring circuit;

a phase-to-frequency converter for converting an output signal from said phase error integrating circuit to a frequency error;

a power supply circuit for supplying electrical energy to said phase error measuring circuit, said phase error integrating circuit, and said phase-to-frequency converter;

a change detecting circuit for detecting an amount of change in integrated phase error which is output from said phase error integrating circuit during a fixed period of time;

a frequency correcting circuit for predicting a frequency correcting quantity between periods of successive ones of said reception time slots with an output signal from said change detecting circuit;

a selector switch for receiving the output signals from said phase-to-frequency converter and said frequency correcting circuit, and for selecting the output signal from said phase-to-frequency converter and outputting the selected output signal to an output terminal thereof during periods of the reception time slots, selecting the output signal from said frequency correcting circuit and outputting the selected output signal to the output terminal between said periods of successive ones of said reception time slots, and outputting a power supply control signal indicative of the presently selected output signal to said power supply circuit; and a frequency controller for controlling the frequency of the receiver depending on an output signal from said selector switch;

said power supply circuit comprising means for preventing electrical energy from being supplied to said phase error measuring circuit, said phase error integrating circuit, and said phase-to-frequency converter when the power supply circuit is supplied with said power supply control signal from said selector switch indicating that the selector switch is selecting the output signal from said frequency correcting circuit.

2. The frequency stabilizer according to claim 1, wherein said change detecting circuit has a subtractor for detecting the difference between phase errors that are outputted from said phase error integrating circuit during the first half and second half of the period of the reception time slot.

3. A frequency stabilizer for use in a radio communications system for transmitting a signal modulated by phase-shift keying in a time-division multiplex process, comprising:

a phase error measuring circuit for measuring a phase error between a symbol point and a signal received by a receiving during a period of each of a plurality of reception time slots;

a phase error integrating circuit for integrating an output signal from said phase error measuring circuit;

a phase-to-frequency converter for converting an output signal from said phase error integrating circuit to a frequency error;

a power supply circuit for supplying electrical energy to said phase error measuring circuit, said phase error integrating circuit, and said phase-to-frequency converter;

a change detecting circuit for detecting an amount of change in integrated phase error which is output from said phase error integrating circuit during a fixed period of time;

a frequency correcting circuit for predicting a frequency correcting quantity between periods of successive ones of said reception time slots with an output signal from said change detecting circuit;

a selector switch for receiving the output signals from said phase-to-frequency converter and said frequency correcting circuit, for selecting the output signal from said phase-to-frequency converter and outputting the selected output signal to an output terminal thereof during periods of the reception time slots, and selecting the output signal from said frequency correcting circuit and outputting the selected output signal to the output terminal between said periods of successive ones of said reception time slots; and a frequency controller for controlling the frequency of the receiver depending on an output signal from said selector switch;

said power supply circuit comprising means for preventing electrical energy from being supplied to said phase error measuring circuit, said phase error integrating circuit, and said phase-to-frequency converter between said periods of successive ones of said reception time slots.

4. The frequency stabilizer according to claim 3, wherein said change detecting circuit has a subtractor for detecting the difference between phase errors which are outputted from said phase error integrating circuit during the first half and second half of the period of the reception time slot.

5. A frequency stabilizer for use in a radio communications system for transmitting a signal modulated by phase-shift keying in a time-division multiplex process, comprising:

a phase error measuring circuit for measuring a phase error between a symbol point and a signal received by a receiver during a period of each of a plurality of reception time slots;

a phase error integrating circuit for integrating an output signal from said phase error measuring circuit;

a phase-to-frequency converter for converting an output signal from said phase error integrating circuit to a frequency error;

a power supply circuit for supplying electrical energy to said phase error measuring circuit, said phase error integrating circuit, and said phase-to-frequency converter;

a change detecting circuit for detecting an amount of change in integrated phase error which is output from said phase error integrating circuit during a fixed period of time;

a selector switch for receiving the output signals from said phase-to-frequency converter and said change detecting circuit, for selecting the output signal from said phase-to-frequency converter and outputting the selected output signal to an output terminal thereof during periods of the reception time slots, selecting the output signal from said frequency correcting circuit and outputting the selected output signal to the output terminal between periods of successive ones of said reception time slots, and outputting a power supply control signal indicative of the presently selected output signal to said power supply circuit;

a frequency correcting circuit for predicting a frequency correcting quantity using an output signal from said selector switch; and a frequency controller for controlling the frequency of the receiver depending on an output signal from said frequency correcting circuit;

said power supply circuit comprising means for preventing electrical energy from being supplied to said phase error measuring circuit, said phase error integrating circuit, and said phase-to-frequency converter when the power supply circuit is supplied with said power supply control signal from said selector switch indicating that the selector switch is selecting the output signal from said change detecting circuit.

6. A frequency stabilizer according to claim 5, wherein said change detecting circuit has a subtractor for detecting the difference between phase errors which are outputted from said phase error integrating circuit during the first half and second half of the period of the reception time slot.

7. A frequency stabilizer for use in a radio communications system for transmitting a signal modulated by phase-shift keying in a time-division multiplex process, comprising:

a phase error measuring circuit for measuring a phase error between a symbol point and a signal received by a receiver during a period of each of a plurality of reception time slots;

a phase error integrating circuit for integrating an output signal from said phase error measuring circuit;

a phase-to-frequency converter for converting an output signal from said phase error integrating circuit to a frequency error;

a power supply circuit for supplying electrical energy to said phase error measuring circuit, said phase error integrating circuit, and said phase-to-frequency converter;

a change detecting circuit for detecting an amount of change in integrated phase error which is output from said phase error integrating circuit during a fixed period of time;

a selector switch for receiving the output signals from said phase-to-frequency converter and said change detecting circuit, for selecting the output signal from said phase-to-frequency converter and outputting the selected output signal to an output terminal thereof during periods of the reception time slots, and selecting the output signal from said frequency correcting circuit and outputting the selected output signal to the output terminal between periods of successive ones of said reception time slots;

a frequency correcting circuit for predicting a frequency correcting quantity using an output signal from said selector switch; and a frequency controller for controlling the frequency of the receiver depending on an output signal from said frequency correcting circuit;

said power supply circuit comprising means for preventing electrical energy from being supplied to said phase error measuring circuit, said phase error integrating circuit, and said phase-to-frequency converter between said periods of successive ones of said reception time slots.

8. The frequency stabilizer according to claim 7, wherein said change detecting circuit has a subtractor for detecting the difference between phase errors which are outputted from said phase error integrating circuit during the first half and second half of the period of the reception time slot.

* * * * *

UNITED STATES PATENT AND TRADEMARK OFFICE
CERTIFICATE OF CORRECTION

PATENT NO. : 5,388,103
DATED : February 7, 1995
INVENTOR(S) : Junichi Ishii

It is certified that error appears in the above-identified patent and that said Letters Patent is hereby corrected as shown below:

Column 5, line 23, delete "de].ay", and insert --delay--.

Column 5, line 33, delete " "T+ ", and insert --"T"--.

Signed and Sealed this

Twenty-sixth Day of March, 1996

*Attest:*

BRUCE LEHMAN

*Attesting Officer*     *Commissioner of Patents and Trademarks*